United States Patent
Eguchi et al.

(10) Patent No.: US 7,545,679 B1
(45) Date of Patent: Jun. 9, 2009

(54) ELECTRICAL ERASABLE PROGRAMMABLE MEMORY TRANSCONDUCTANCE TESTING

(75) Inventors: Richard K. Eguchi, Austin, TX (US); Chen He, Cedar Park, TX (US); Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 24 days.

(21) Appl. No.: 11/966,068

(22) Filed: Dec. 28, 2007

(51) Int. Cl.
*G11C 16/00* (2006.01)
(52) U.S. Cl. .............. 365/185.22; 365/185.09
(58) Field of Classification Search ............. 365/185.02
See application file for complete search history.

(56) References Cited

U.S. PATENT DOCUMENTS

| 5,521,867 | A | 5/1996 | Chen et al. | |
|---|---|---|---|---|
| 6,233,178 | B1 * | 5/2001 | Krishnamurthy et al. | 365/185.33 |
| 6,834,012 | B1 * | 12/2004 | He et al. | 365/185.18 |
| 7,218,553 | B2 | 5/2007 | Devin | |
| 7,453,732 | B2 * | 11/2008 | Devin | 365/185.22 |

* cited by examiner

*Primary Examiner*—Tan T. Nguyen

(57) ABSTRACT

A test method determines if an array of a Flash EEPROM circuit has a bit cell with a transconductance (gm) that is deficient. The method preconditions all bit cells of the array to a particular programmed state and then determines whether any of the bit cells exhibit undesirable operating characteristics by reading each bit cell to determine whether its transconductance is less than desirable.

20 Claims, 6 Drawing Sheets

ELECTRICAL ERASABLE PROGRAMMABLE MEMORY TRANSCONDUCTANCE TESTING

BACKGROUND OF THE INVENTION

1. Field of the Invention

This invention relates in general to electrically erasable programmable read only memories and more particularly to a method of testing transconductance of the cells of such memories.

2. Description of the Related Art

Electrically erasable programmable read only memories (EEPROM) such as flash memories are used for non volatile memory storage of information for data processing systems.

As dimensions for Flash EEPROM cells continue towards smaller geometries, degraded transconductance (gm) bitcells and/or the gm degradation of the bitcells during use poses a reliability issue. In particular, degraded gm bitcells cause reliability and/or performance issues and can result in a failure condition of the Flash EEPROM or the integrated circuit that incorporates the Flash EEPROM.

Accordingly, there is a need for an improved method and apparatus for overcoming the problems in the art as discussed above.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

EEPROM cells such as flash memory cells can be characterized with use of a transconductance (gm) curve. In particular, an EEPROM cell conducts a current based on the voltage applied to its word line (with the bit line set to a particular value). A bit having bad transconductance can be determined with use of a transconductance curve for the bitcell, wherein transconductance of the bitcell which deviates from normal can provide an indication of a bad bit cell. Accordingly, the embodiments of the present disclosure advantageously provide a method for detecting and substantially eliminating degraded gm bitcells in production testing (for repair or rejection) and can also provide a method for early warning eminent failure notification in customer applications.

In one embodiment, the method includes preconditioning and normalizing all bits to the same current and threshold voltage (Vt) pivot point. In addition, the method robustly identifies "bad" gm bitcells on all bits being tested as the same pivot point is established. In one embodiment, all bits are preconditioned with a weak program operation with high granularity to fix all bits at a predefined Ids and Vt level. According to another aspect, the method determines whether the off-state leakage is low, noting that some bits may program faster than others, and that a gross test may not measure the true gm of all bitcells. Furthermore, the embodiments of the present disclosure advantageously provide a method and apparatus for enabling customer diagnostics of a diagnostic tool to flag a user of the presence a potential eminent failure condition has been found. In response to detection of presence of a potential eminent failure condition being found, appropriate measures can be carried out before the occurrence of an actual failure.

Figure 1:
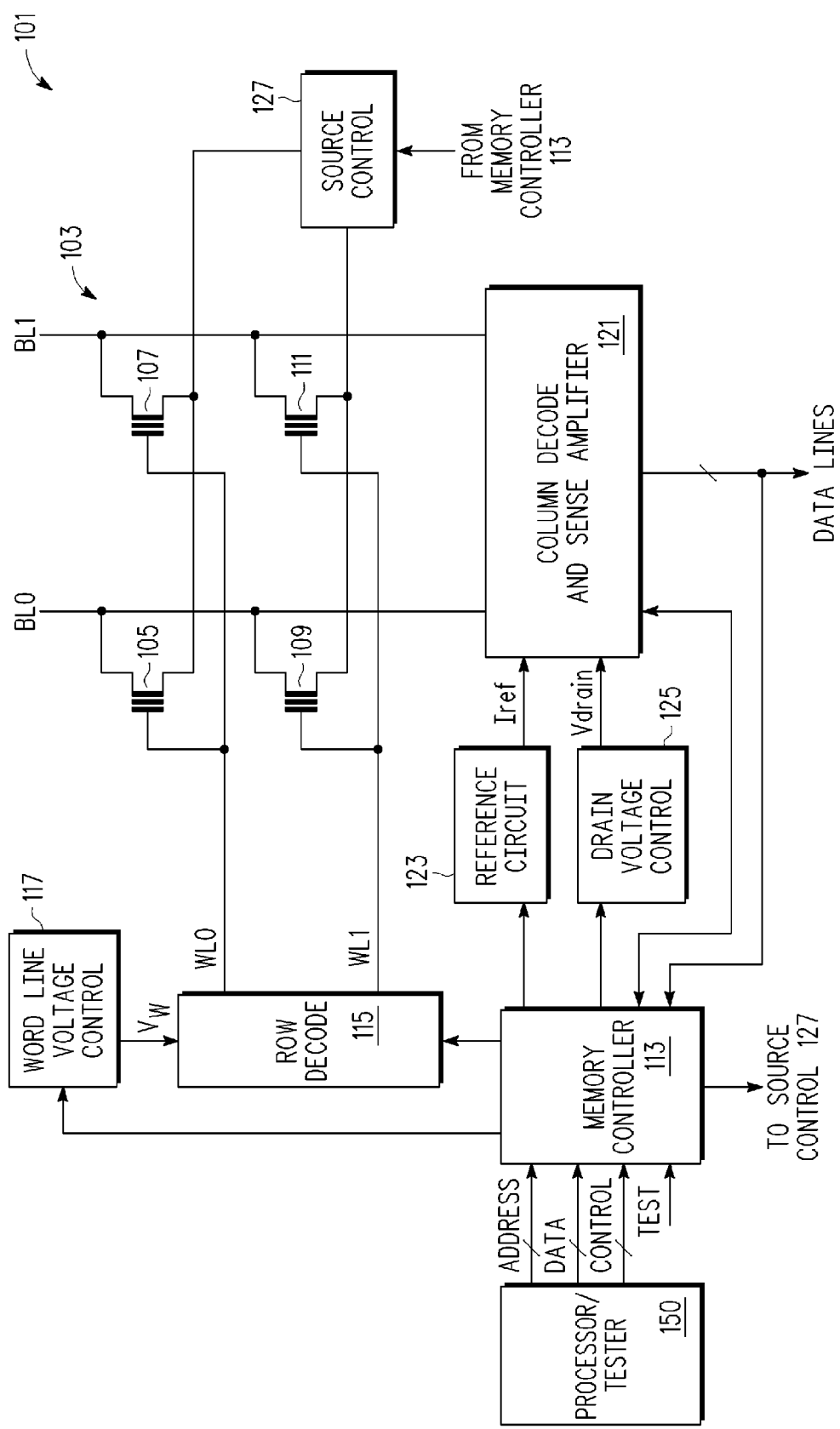
FIG. 1 is a block diagram of a memory circuit according to one embodiment of the present invention.

FIG. 1 is a memory circuit 101 that has an array 103 of EEPROM cells and circuitry for determining whether any of the cells have a bad transconductance (gm) curve.

In the embodiment shown, memory array 103 includes four flash EEPROM cells 105, 107, 109, and 111. In one embodiment, the cells are floating gate flash memory cells although other types of flash memory cells (e.g. nanocrystals, split gate flash, nitride based memories) may be implemented. Also, other types of EEPROM cells may be implemented in array 103. In the embodiment shown, array 103 includes 4 memory cells for illustrative purposes, but may include a greater number in other embodiments.

Memory circuit 101 includes a row decoder 115 for selectively providing voltages Vw from word line voltage control circuit 117 to the word lines WL0 and WL1 during memory operations. These words lines are connected to the gates of the memory cells of array 103. Circuitry 101 also includes a column decoder and sense amplifier circuit 121 that includes sense amplifiers for coupling to the bit lines BL0 and BL1 for reading the cells of array 103 and circuitry for applying a Vdrain voltage from drain voltage control circuit 125 to the bit lines BL0 and BL1 during memory operations. Circuit 121 outputs the data read from the cells on data lines. Circuit 101 also includes a current reference circuit 123 for supplying a reference current Iref to a reference sense amplifier of circuit 121 for voltage reads of the cells circuit 121.

Circuit 101 includes a memory controller 113 for controlling the operations of circuit 101 during its operation. Controller 113 controls wordline voltage control 117, reference circuit 123, drain voltage control 125, and source control 127 to control the voltage and current values provided by those circuits during memory operation. Memory controller 113 also provides control information to control the operations of row decode circuit 115 and circuit 121 during memory operation. Controller 113 includes address, data, and control lines for receiving address, data and control information from an external source (e.g. a processor) for performing memory operations. In the embodiment shown, one of the control lines includes a test line for signaling controller 113 to enter a test mode to determine whether a cell of array 103 has a bad gm curve. Other memory circuits may have other configurations in other embodiments.

Memory circuit 101 is coupled to a processor 150 via the address, data, and control lines. In one embodiment, processor 150 may be on the same integrated circuit or may be on a different integrated circuit.

Figure 2:
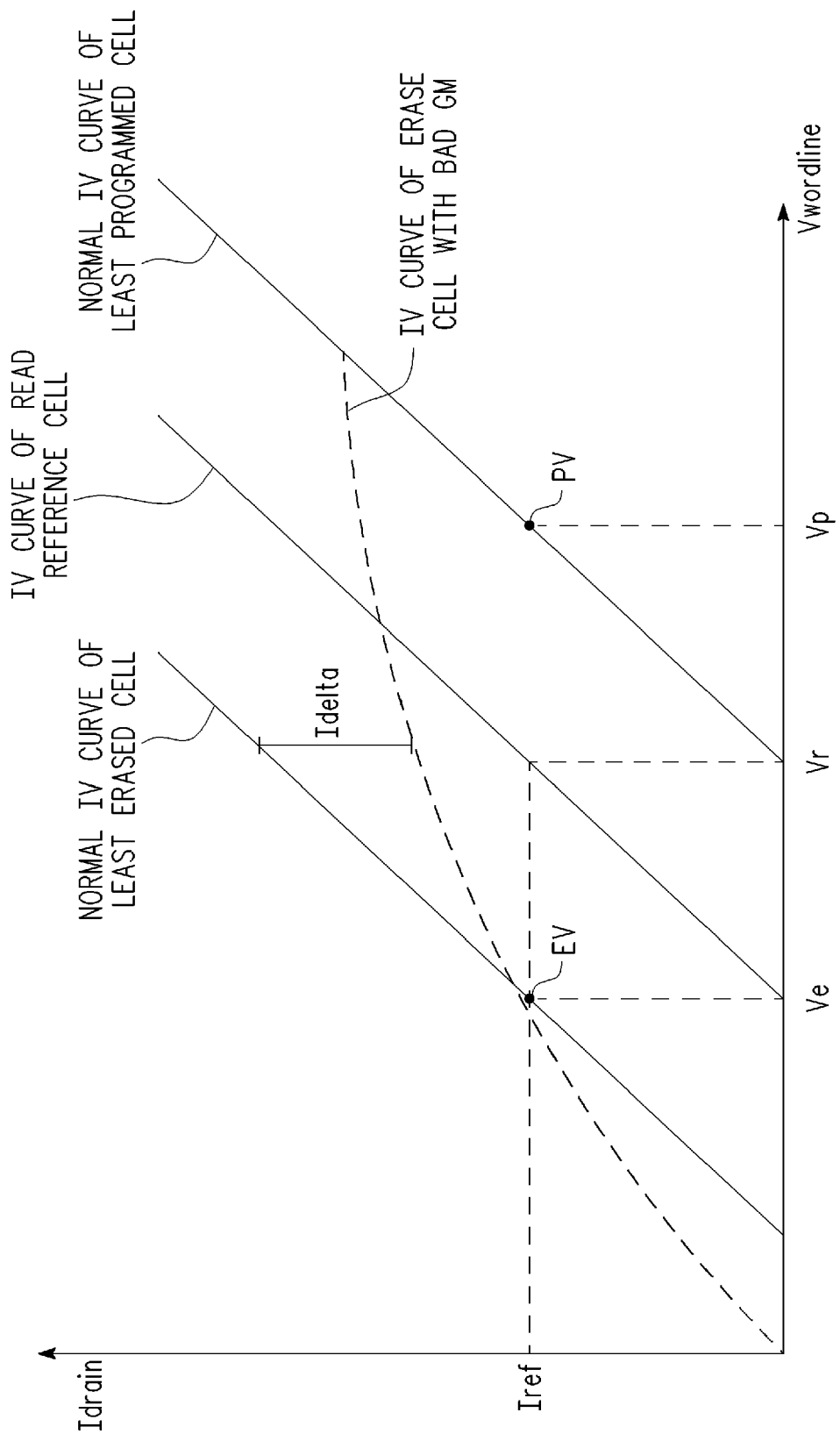
FIG. 2 is a graph illustrating a bit cell with a bad transconductance curve.

FIG. 2 shows a graph illustrating problems of an array having a bad gm curve for memory device operation. The X axis represents the voltage (Vwordline) applied to a word line of a bit cell during a read and the Y axis represents the drain current (Idrain) (bit line current) of a bit cell during a memory read.

Plotted on FIG. 2 are the current-voltage (IV) curves for a normal bit cell of the least erased cell of an array, the IV curve for a read reference cell of an array, and the IV curve for a normal least programmed cell of the array. The slope of these curves is the transconductance (gm) of the cells. In an ideal memory array, the slope of these three curves parallel each other such that regardless of the word line voltage, there will be drain current differentiation between the three curves. For example, if a read voltage Vr is applied to the wordline, a drain current of Iref will be produced by the reference cell. A cell producing a higher drain current will be read as an erased cell. A cell producing a lower drain current will be read as a programmed cell.

During erasing, erase voltages are applied to the cell until the cell produces a higher current than Ev at the verify voltage Ve during a test read. During programming, programming voltages are applied to the cell until the cell produces a lower drain current than PV at the program verify wordline voltage Vp during a test read. Such programming with memory cells having normal gm curves allows for sufficient differentiation of drain currents between the erased cells and programmed cells for accurate reading of the cells during memory operation.

FIG. 2 also illustrates an IV curve for an erased cell with a "bad" gm curve. In the embodiment of FIG. 2, the slope of the IV curve is less than that for a normal curve. In the example shown, the bad cell may be erased such that its drain current at wordline voltage Ve is higher than EV thereby testing as an erased cell. However, because its gm curve is lower, the drain current at Vr is less than that of the normal least erased cell (illustrated as Idelta). The less differential from the reference cell at Vr means that there is a greater likelihood that that cell may provide for a false read. In addition, a low gm curve may present similar problems in programming in that a programmed cell may have a smaller drain current than program value PV at wordline voltage Vp but still may not provide a sufficiently low drain current at voltage Vr.

In some embodiments, a lower gm curve of a cell may be indicative of a manufacture defect in the cell. Furthermore, the gm of a flash cell may degrade over time due to electrical stress on the cell. Thus, a cell which may provide acceptable test results in drain current at voltages Ve, Vr, and Vp during manufacture testing, may fail over time due to such stress. Accordingly, it is desirable to determine whether a cell has a bad gm during manufacture even if such a cell may pass read tests during manufacture.

Figure 3:
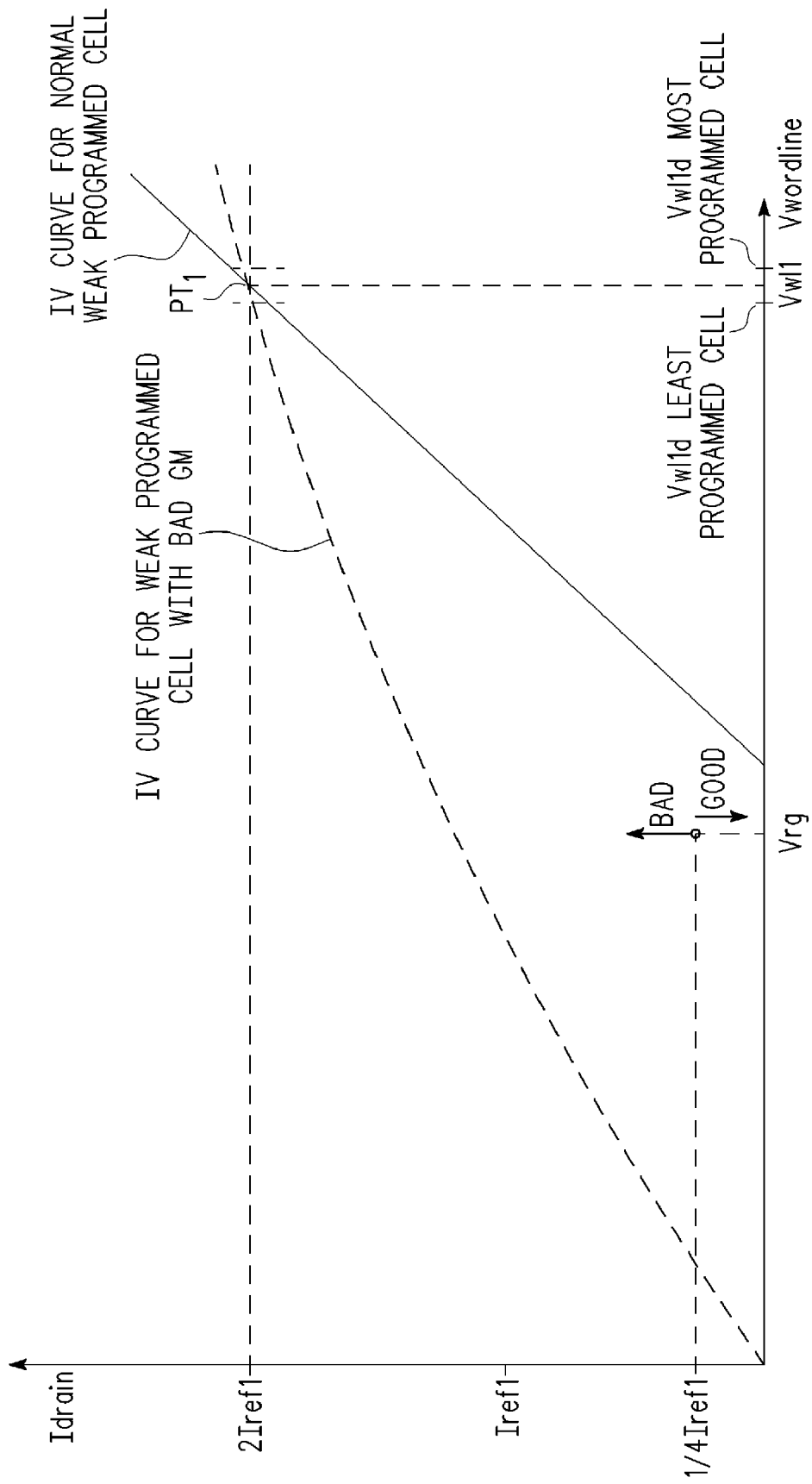
FIG. 3 is a graph illustrating aspects of a test for determining whether a bit cell has a bad transconductance curve according to one embodiment of the present invention.

FIG. 3 is a graph illustrating concepts of a method for determining a cell with a bad gm curve according to one embodiment of the present invention. In the embodiment shown, all cells of an array are initially programmed such that they produce particular a drain current (e.g. 2Iref1) at a particular higher wordline voltage Vwl1 (point PT1 in FIG. 3).

In one embodiment, this initial programming is performed by a "weak" programming operation where a reduced gate voltage (word line) and a reduced drain voltage is applied to the cell. Such gate and drain voltages are reduced from values utilized during programming the cell for normal operation. For example, for a memory array where a gate voltage of 9.3 V and a drain voltage of 5 V are applied during normal operations, a gate voltage of 5 V and a drain voltage of 4 V may be applied for weak programming for the initial programming. Other voltages may be used in other embodiments. In one embodiment, weak programming is used to achieve a "tighter" distribution of wordline voltages at a drain current of 2Iref1 than could be obtained with regular programming. This tighter distribution provides for a more accurate test in finding cells with bad gm. In one embodiment, each cell is programmed such that each cell produces a drain current of 2Iref1 and the world line voltage of the most programmed cell is within 500 mv of the wordline voltage of the least programmed cell.

FIG. 3 illustrates the IV curve for a normal cell (normal gm) that has been programmed to point PT1. Also illustrated in FIG. 3 is an IV curve for a cell with a bad gm curve. In the embodiment shown, the cell with a bad gm curve will have a higher drain current at a lower wordline voltage than voltage Vwl1.

In one embodiment, Iref1=12 micro amps, 2 Iref1=24 micro amps, and ¼ Iref1=3 micro amps. Other current values, including other ratios of Iref may be used in other embodiments.

To determine whether a particular cell has a bad gm, the cell is read with a wordline voltage of Vrg which is less than Vwl1. If the cell has a higher drain current than a particular value (e.g. ¼ Iref1), then the cell is considered to have a bad gm curve. If a cell has a drain current of less than ¼ Iref1, then the cell is considered to have an acceptable gm.

Figure 4:
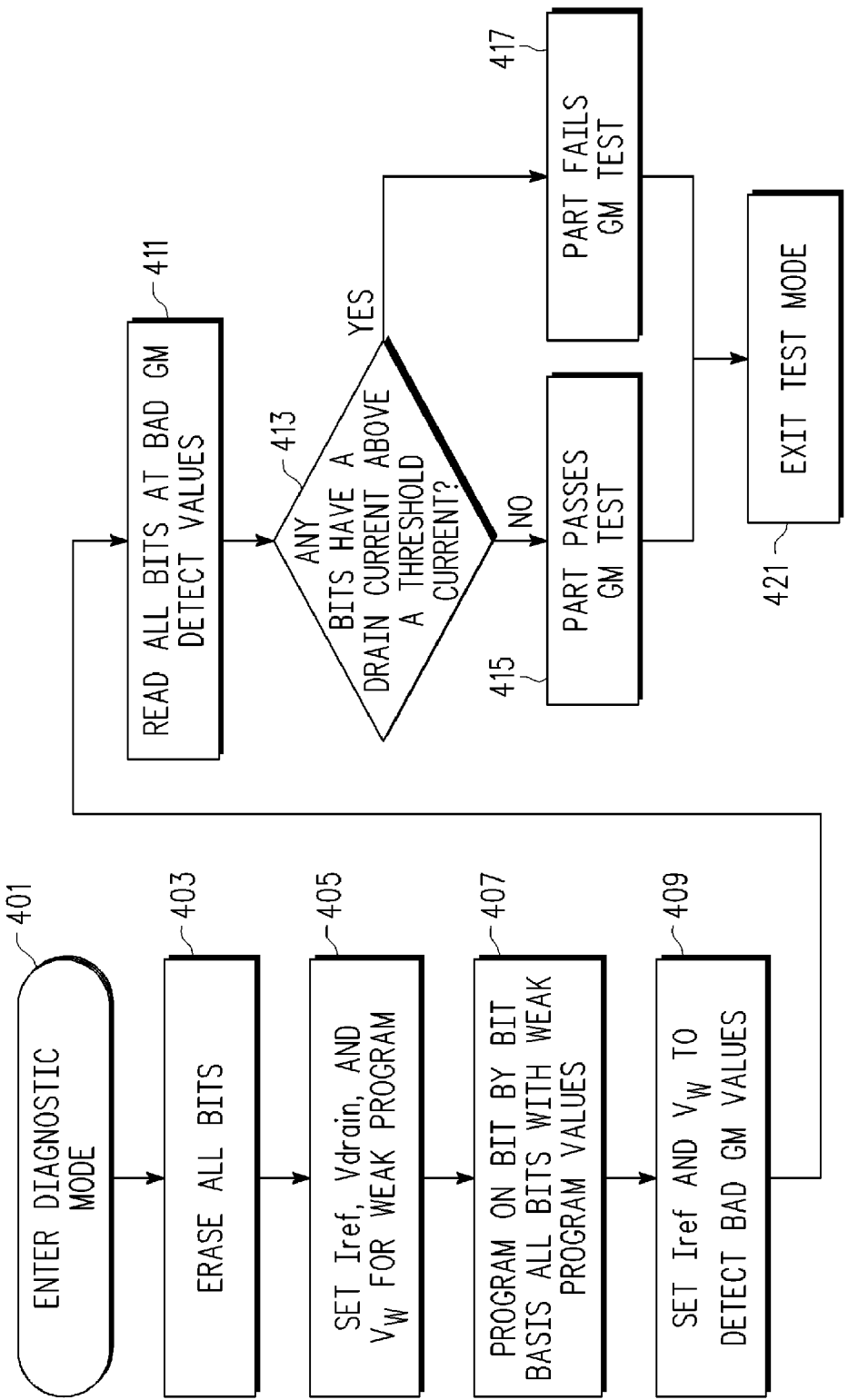
FIG. 4 is a flow diagram for determining whether a memory circuit has a bit cell with a bad transconductance curve according to one embodiment of the present invention.

FIG. 4 is a flow diagram of one method for determining whether a memory circuit includes a bit cell with a bad gm curve. In operation 401, the memory circuit enters a diagnostic mode. In one embodiment a diagnostic mode is entered when memory controller 113 receives a signal on the test line to enter the diagnostic mode. In other embodiments, memory cell enters a diagnostic mode when it receives commands from a processor (e.g. 150) or external tester.

In operation 403, all bits of the array are erased. In one example, the erase operation may be performed on a block by block basis for an array with multiple blocks.

In operation 405, the controller 113 sets the wordline control circuit 117 to provide the appropriate word line voltage, the reference circuit 123 to provide the appropriate reference current value, and the drain control circuit to provide the appropriate drain voltage for weak programming of each cell. Each cell is then programmed on a bit by bit basis in operation 407 to the state such that each cell produces a particular drain current (e.g. 2Iref1 in FIG. 3) by applying a wordline voltage within a particular range (e.g. Vwl1 in FIG. 3). In one embodiment, programming is performed by applying programming pulses to a cell followed by a verify read to see if the cell is programmed within the desired read characteristics.

After all of the cells have been programmed to the desired programming state in operation 407, memory controller 113, in operation 409, resets the Iref and Vwordline values for the detection of a cell with a bad gm curve. In the embodiment of FIG. 3, the reference current to the reference cell is set at ¼ Iref1 and the word line voltage is set to Vrg. These values are set to less than those in program operation 407 to test the cell at different values in the gm curve.

In operation 411, all of the bits are read to determine if any of the cells produce a drain current that is greater than the threshold current ¼ Iref1 (the reference current provided to the reference cell). In one embodiment, this is performed by reading each cell with its wordline voltage set to Vrg and comparing the drain current of the cell with the drain current of the reference cell. A drain current of higher than the reference cell drain current indicates that the cell is in the erased state. If in 413 a cell is read as having a higher drain current than ¼ Iref1, then in operation 417, the memory circuit is deemed to fail in that at least one cell has a bad gm curve. If none of the cells have a higher drain current than ¼ Iref1, then the memory circuit is deemed to pass the gm test in operation 415. In operation 421, memory circuit 101 exits test mode.

In the embodiment of FIG. 4, if any cell has a bad gm, then the memory circuit is deemed defective. In one embodiment, the integrated circuit including the memory circuit is discarded. However, it other embodiments, the cell or cells with defective gms may be identified wherein such calls may be replaced with redundant memory cells of the circuit. Still in other embodiments, cells that are defective may be marked as unusable for storage.

In one embodiment, the memory controller is controlled by processor 150 via the control lines for performing the operations of FIG. 4. In another, memory circuit 101 is coupled to a tester during testing for controlling memory controller 113 during testing.

Utilizing the above method for testing a memory array provides for a method for testing the array for cells with bad transconductance curves during manufacture to determine whether any of the cells are defective in a memory array. Accordingly, accurate testing may be performed before sending a defective part to a customer.

In one embodiment, memory controller 113 includes registers for storing whether the part failed or passed the gm test. In some embodiments, controller 113 includes registers for storing the addresses of the failed cells.

Figure 5:
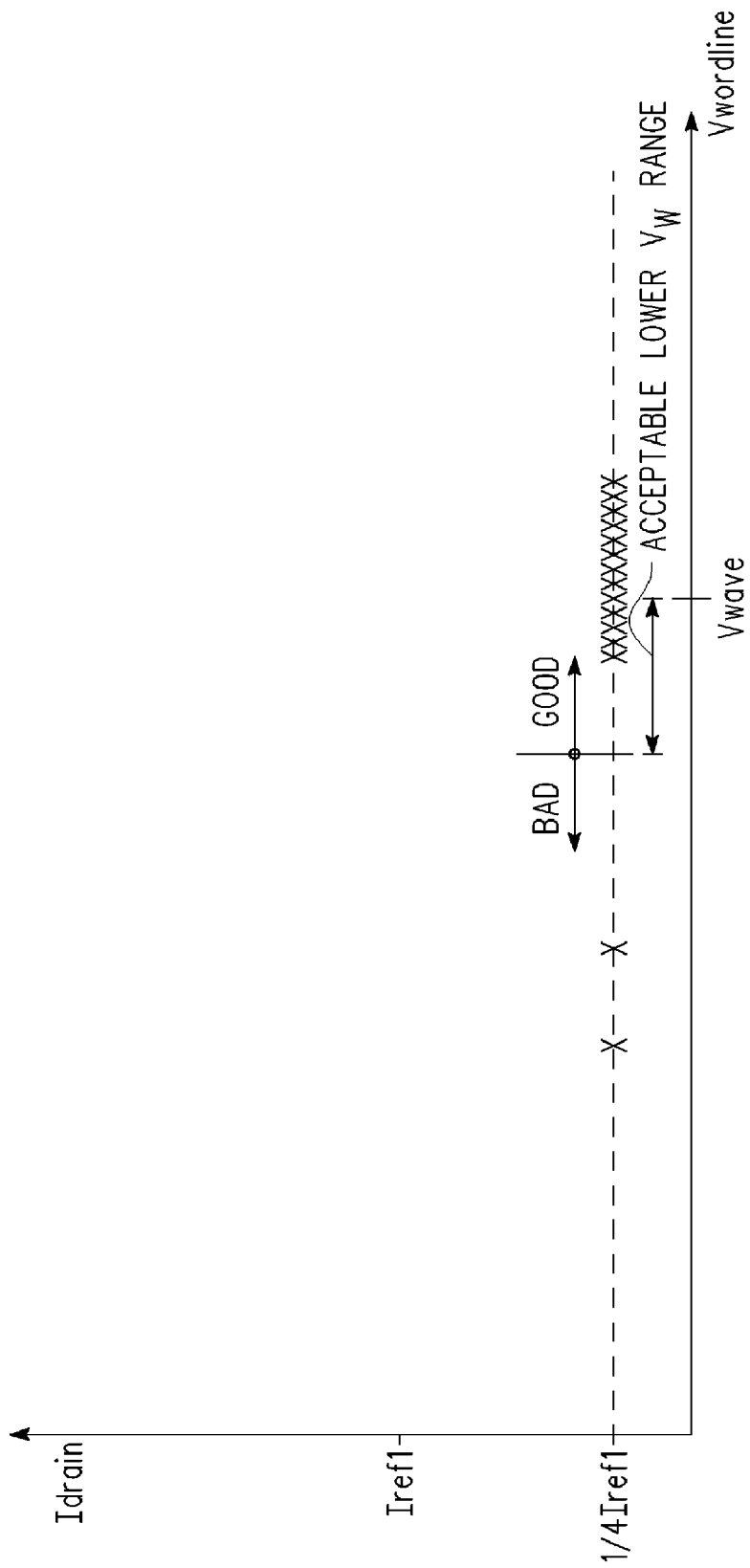
FIG. 5 is a graph illustrating aspects of a test for determining whether a bit cell has a bad transconductance curve according to another embodiment of the present invention.

FIG. 5 is a graph setting forth a second embodiment for determining whether a cell has a bad gm curve. Like the embodiment of FIG. 3, in this embodiment, all of the cells are programmed to a particular programmed state (e.g. to programmed state PT1 in FIG. 3). However, in this embodiment, a cell is determined to be defective if the minimum voltage applied to a wordline to make the cell produce a particular drain current is less than a particular voltage.

In the embodiment of FIG. 5, the reference current is set at a particular threshold (e.g. at ¼ Iref1). Iref1 is the reference current provided to the reference cell for reading the reference cell during normal read operations. A cell is deemed to have a defective gm if the wordline voltage applied to the cell for the cell to produce the particular drain current is less than a particular voltage value. Such a condition after the cell has been preconditioned to a particular programmed state (e.g. state PT1 in FIG. 3) would indicate that the gm of that cell is defective.

The average gm for cells of an array may vary due to manufacturing conditions of the wafer that produced the memory array. A variance in all of the gm curves for an array in the same way may not necessarily cause a failure in the part in that the reference cell would also have the same variance in its gm as well.

Accordingly, in the embodiment of FIG. 5, the particular voltage threshold between a good gm and a bad gm may be based on the characteristics of the device to account for variations in its manufacture. In one embodiment, the particular minimum wordline voltage for determining a bad gm would be based on an average wordline voltage of the array for producing a particular drain current. In the embodiment of FIG. 5, an indication of the average wordline voltage (Vw ave) of the cell is determined. A cell is considered to have a bad gm if its wordline voltage to produce a particular drain current is outside a predetermined range of the average. In one embodiment, a cell would be deemed to have a bad gm if its wordline voltage is greater than 250 mill volts from the average wordline voltage. Other ranges may be used in other embodiments.

Providing a system where the test for determining a bad gm is based on average operating parameters of an array provides for a test that can account for variations in manufacturing conditions. Accordingly, such a test may yield less false positives for gm defect detectability.

Figure 6:
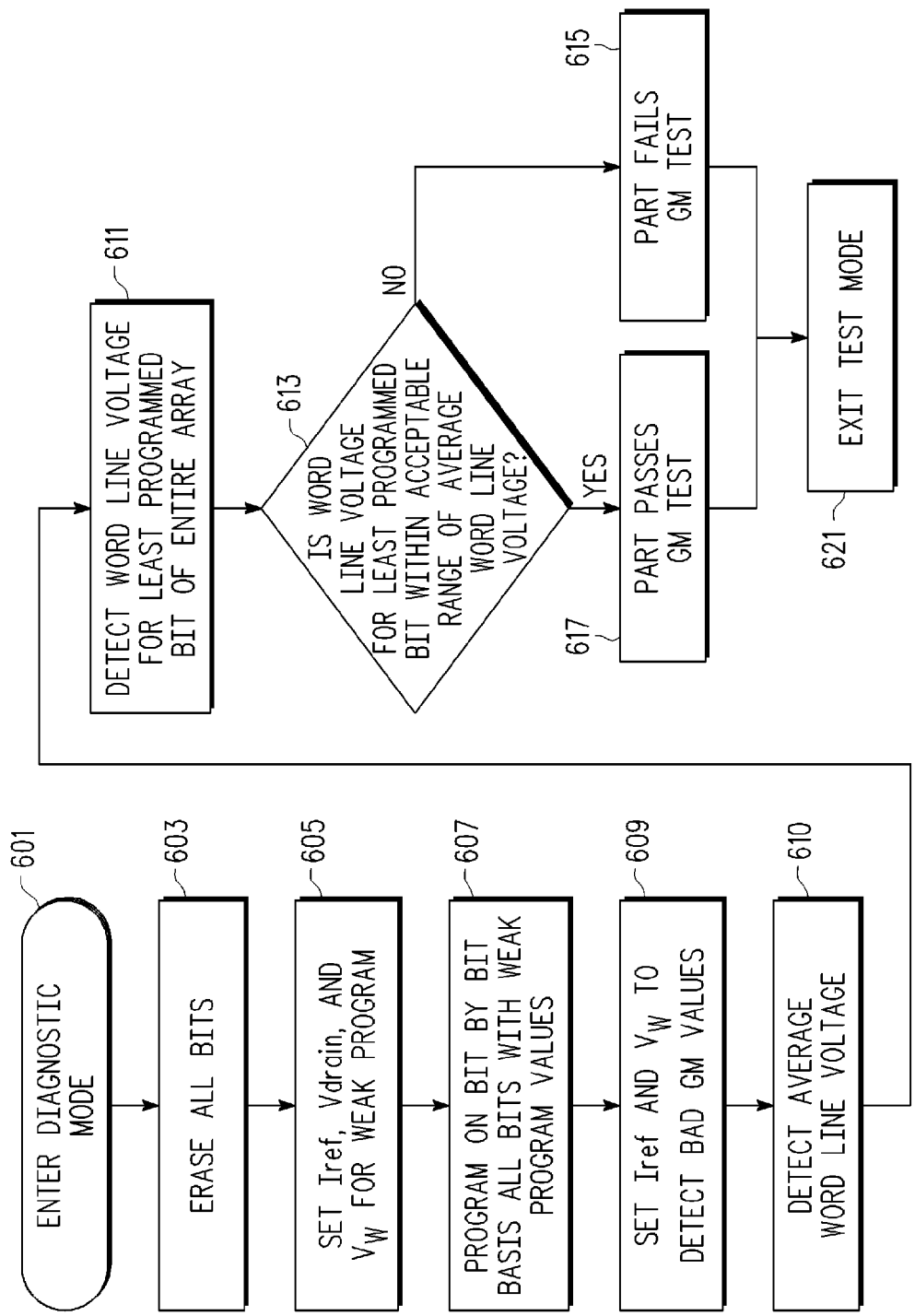
FIG. 6 is a flow diagram for determining whether a memory circuit has a bit cell with a bad transconductance curve according to another embodiment of the present invention.

FIG. 6 is a flow chart illustrating a method of implementing the embodiment of FIG. 5. Operations 601, 603, 605, and 607 for preconditioning the cells to particular programmed state (e.g. PT1 of FIG. 3) are similar to operations 401, 403, 405, and 407 of the embodiment of FIG. 4.

In operation 609, the current Iref to the reference cell is set to a value for detecting cells with a bad gm. In one embodiment, the reference current is set to ¼ Iref1.

In operation 611, the average wordline voltage of the cells in the array for producing a drain current of ¼ Iref1 is determined. In one embodiment, the average wordline voltage is determined by measuring the wordline voltage for each cell. However, in other embodiments, the average wordline voltage is determined by measuring the average wordline voltage for a subset of the memory array (e.g. for a page of cells of the memory array). By using a subset of memory cells for wordline voltage determination, the time needed to determine the average wordline voltage is reduced.

In operation 611, the word line voltage for the least programmed cell is determined. In one embodiment, this operation is performed by setting each wordline at 0 volts and individually applying an increasing voltage to each line until a drain current is detected on a bit line as being above ¼ Iref1. For example, 0.25 volts is initially applied sequentially to each word line. This voltage is increased by 0.25 volts until a drain current of greater than ¼ Iref1 is detected. If the first detected wordline voltage for the least programmed cell is within the acceptable range in decision 613, then in operation 615, the memory circuit is deemed to have passed. If the first detected wordline voltage for the least programmed cell is outside the range, then the part is deemed to have failed the gm detect ability test in operation 617. The test mode is exited in operation 621. In one embodiment, the acceptable range is within 250 millivolts of the average wordline voltage.

In another embodiment, determining whether an array includes a cell having a wordline voltage outside the acceptable range can be performed by setting the word line voltage to a voltage that is immediately outside the acceptable range and determining if any bit cells on that wordline has a drain current of greater than ¼ Iref1. If no cell on any wordline is detected have a drain current of greater then ¼ Iref1 at that voltage, then the memory circuit is determined to pass.

By now it should be appreciated that there has been provided a method for detecting degraded transconductance in bit cells of a memory array comprises pre-conditioning, reading, and determining as follows. The method includes performing a pre-conditioning program operation on the bit cells with use of a pre-conditioning reference current and pre-conditioning bit line and word line voltages to render the bit cells programmed. The programmed bit cells collectively have a pre-conditioning threshold voltage distribution width less than a threshold voltage distribution width resulting from a normal program operation on the bit cells. The method also includes reading all bit cells with use of a verification reference current and verification word line voltage, the verification reference current and word line voltage being different from the pre-conditioning reference current and word line voltage, respectively. In addition, the method includes determining whether any read bit cell is erased, as opposed to being programmed, wherein (i) responsive to any bit cell being erased, then at least one bit cell of the memory array is detected as having degraded transconductance, and (ii) responsive to no bit cell being erased, then no bit cell of the memory array is detected as having degraded transconductance.

The pre-conditioning program operation can comprise programming the bit cells on a bit by bit basis with predefined values of increased reference current (Iref), reduced bit line or drain voltage (Vbl), and reduced word line or gate voltage (Vwl) with respect to corresponding values for the normal program operation. In one embodiment, the predefined values for the pre-conditioning program operation comprise a reference current of 24 microamps, a bit line voltage of 4.0 volts, and a word line voltage of 5.0 volts, and wherein the corresponding values for the normal program operation comprise a reference current of 12 microamps, a bit line voltage of 5.0 volts, and a word line voltage of 9.3 volts.

According to another embodiment, the verification reference current and verification word line voltage comprise degraded transconductance detect values. In addition, prior to reading all bit cells at degraded transconductance detect values, the method further comprises establishing degraded transconductance detect values by setting a value for a reduced reference current (Iref) and setting a value for a degraded transconductance detect word line voltage (Vwl). In a further embodiment, the reduced reference current (Iref) comprises one-quarter of the normal program operation reference current (Iref) and wherein the degraded transconductance detect word line voltage (Vwl) comprises a voltage (i) below the corresponding word line voltage for the normal pre-conditioned programmed bit cells and (ii) above the word line voltage for a bit cell of degraded transconductance.

According to yet another embodiment, the method includes wherein the verification reference current (Iref) comprises one-quarter of a normal program operation reference current (Iref) and wherein the value for the verification word line voltage (Vwl) comprises a voltage equal to (i) an average word line voltage for all bit cells minus (ii) a degraded transconductance detection limit. In addition, the degraded transconductance detection limit comprises one-half of the pre-conditioning threshold voltage distribution width. Still further, the degraded transconductance detection limit can comprise 250 millivolts.

In another embodiment, the verification reference current (Iref) comprises one-quarter of a normal program operation reference current (Iref) and wherein the value for the verification word line voltage (Vwl) is selected across a range of voltages from an average voltage to a voltage corresponding to a least programmed bit. The method further comprises instead of determining whether any read bit cell is erased, determining whether the lowest value of word line voltage (Vwl) for the least programmed bit occurs at a voltage above a Vwl_lower_limit value. Responsive to the lowest value of word line voltage (Vwl) being lower than the Vwl_lower_limit value, then at least one bit cell of the memory array is detected as having degraded transconductance. Responsive to the lowest value of word line voltage (Vwl) being greater than or equal to the Vwl_lower_limit value, then no bit cell of the memory array is detected as having degraded transconductance. In addition, the least programmed bit can represent the bit cell having a lowest value of word line voltage (Vwl) in the pre-conditioning threshold voltage distribution.

In a further embodiment, the Vwl_lower_limit value can equal (i) an average word line voltage for all bit cells minus (ii) a degraded transconductance detection limit. In addition, the degraded transconductance detection limit can comprise one-half of the pre-conditioning threshold voltage distribution width. Still further, in one embodiment, the degraded transconductance detection limit can comprise 250 millivolts.

According to another embodiment, the step of determining whether any bit cell read is erased further comprises (i) responsive to any bit cell being erased, then failing the memory array as having detected degraded transconductance in at least one bit cell of the memory array, and (ii) responsive to no bit cell being erased, then passing the memory array as not having detected degraded transconductance in any bit cell.

In another embodiment, a method for detecting degraded transconductance in bit cells of a memory array comprises: performing a pre-conditioning program operation on the bit cells with use of a pre-conditioning reference current and pre-conditioning bit line and word line voltages to render the bit cells programmed, the programmed bit cells collectively having a pre-conditioning threshold voltage distribution width less than a threshold voltage distribution width resulting from a normal program operation on the bit cells; reading all bit cells with use of a verification reference current and verification word line voltage, the verification reference current and word line voltage being different from the pre-conditioning reference current and word line voltage, respectively, wherein the verification reference current (Iref) comprises one-quarter of a normal program operation reference current (Iref); and performing one selected from the group consisting of (i) determining whether any read bit cell is erased, as opposed to being programmed, wherein (a) responsive to any bit cell being erased, then at least one bit cell of the memory array is detected as having degraded transconductance, and (b) responsive to no bit cell being erased, then no bit cell of the memory array is detected as having degraded transconductance, and (ii) determining whether the lowest value of word line voltage (Vwl) for the least programmed bit occurs at a voltage above a Vwl_lower_limit value, wherein (a) responsive to the lowest value of word line voltage (Vwl) being lower than the Vwl_lower_limit value, then at least one bit cell of the memory array is detected as having degraded transconductance, and (b) responsive to the lowest value of word line voltage (Vwl) being greater than or equal to the Vwl_lower_limit value, then no bit cell of the memory array is detected as having degraded transconductance. The value for the verification word line voltage (Vwl) is selected across a range of voltages from a minimum voltage to a voltage corresponding to a least programmed bit. In addition, the method comprises further wherein (iii) responsive to any bit cell being erased or the lowest value of word line voltage (Vwl) being lower than the Vwl_lower_limit value, then failing the memory array as having detected degraded transconductance in at least one bit cell of the memory array, and (iv) responsive to no bit cell being erased or the lowest value of word line voltage (Vwl) being greater than or equal to the Vwl_lower_limit value, then passing the memory array as not having detected degraded transconductance in any bit cell. Still further, the method includes wherein the pre-conditioning program operation comprises programming the bit cells on a bit by bit basis with predefined values of increased reference current (Iref), reduced bit line voltage (Vbl), and reduced word line voltage (Vwl) with respect to corresponding values for the normal program operation.

In yet another embodiment, a method for detecting degraded transconductance in bit cells of a memory array comprises: performing a pre-conditioning program operation on the bit cells with use of a pre-conditioning reference current and pre-conditioning bit line and word line voltages to render the bit cells programmed, the programmed bit cells collectively having a pre-conditioning threshold voltage distribution width less than a threshold voltage distribution width resulting from a normal program operation on the bit cells, wherein the pre-conditioning program operation comprises programming the bit cells on a bit by bit basis with predefined values of increased reference current (Iref), reduced bit line voltage (Vbl), and reduced word line voltage (Vwl) with respect to corresponding values for the normal program operation; reading all bit cells with use of a verification reference current and verification word line voltage, the verification reference current and word line voltage being different from the pre-conditioning reference current and word line voltage, respectively, wherein the verification reference current (Iref) comprises one-quarter of a normal program operation reference current (Iref) and wherein the value for the verification word line voltage (Vwl) is selected across a range of voltages from a minimum voltage to a voltage corresponding to a least programmed bit; and performing one selected from the group consisting of (i) determining whether any read bit cell is erased, as opposed to being programmed, wherein (a) responsive to any bit cell being erased, then at least one bit cell of the memory array is detected as having degraded transconductance, and (b) responsive to no bit cell being erased, then no bit cell of the memory array is detected as having degraded transconductance, and (ii) determining whether the lowest value of word line voltage (Vwl) for the least programmed bit occurs at a voltage above a Vwl_lower_limit value, wherein (a) responsive to the lowest value of word line voltage (Vwl) being lower than the Vwl_lower_ limit value, then at least one bit cell of the memory array is detected as having degraded transconductance, and (b) responsive to the lowest value of word line voltage (Vwl) being greater than or equal to the Vwl_lower_limit value, then no bit cell of the memory array is detected as having degraded transconductance.

In other embodiments, other memory circuits may have other configurations. Further, the memory circuits may be implemented with other circuitry of an integrated circuit such as a microprocessor or microcontroller. Still in other embodiments, other methodologies can include determining whether a cell has defective gm using the cell's gm curve.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

As discussed herein, in one embodiment, with respect to a bit cell that is in a programmed state, programmed means that the bit cell provides less current than the reference current. With respect to a bit cell that has been erased, erased means that the bit cell provides a greater current than the reference current. Furthermore, while various embodiments as disclosed herein include preconditioning the array using a higher Iref and then looking for degraded gm bits with lower Iref, it is to be understood that a similar objective can be met by swapping the Iref values. In other words, the method can precondition the array (or a subset of the array) with lower Iref and then look for degraded gm bits of the array (or the subset of the array) with higher Iref.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for detecting degraded transconductance in bit cells of a memory array comprising:
    performing a pre-conditioning program operation on the bit cells with use of a pre-conditioning reference current and pre-conditioning bit line and word line voltages to render the bit cells programmed, the programmed bit cells collectively having a pre-conditioning threshold voltage distribution width less than a threshold voltage distribution width resulting from a normal program operation on the bit cells;
    reading all bit cells with use of a verification reference current and verification word line voltage, the verification reference current and word line voltage being different from the pre-conditioning reference current and word line voltage, respectively; and
    determining whether any read bit cell is erased, as opposed to being programmed, wherein (i) responsive to any bit cell being erased, then at least one bit cell of the memory array is detected as having degraded transconductance, and (ii) responsive to no bit cell being erased, then no bit cell of the memory array is detected as having degraded transconductance.

2. The method of claim 1, wherein the pre-conditioning program operation comprises programming the bit cells on a bit by bit basis with predefined values of increased reference current (Iref), reduced bit line voltage (Vbl), and reduced word line voltage (Vwl) with respect to corresponding values for the normal program operation.

3. The method of claim 2, wherein the predefined values for the pre-conditioning program operation comprise a reference current of 24 microamps, a bit line voltage of 4.0 volts, and a word line voltage of 5.0 volts, and wherein the corresponding values for the normal program operation comprise a reference current of 12 microamps, a bit line voltage of 5.0 volts, and a word line voltage of 9.3 volts.

4. The method of claim 1, wherein the verification reference current and verification word line voltage comprise degraded transconductance detect values.

5. The method of claim 4, wherein prior to reading all bit cells at degraded transconductance detect values, the method further comprising:
    establishing degraded transconductance detect values by setting a value for a reduced reference current (Iref) and setting a value for a degraded transconductance detect word line voltage (Vwl).

6. The method of claim 5, wherein the reduced reference current (Iref) comprises one-quarter of the normal program operation reference current (Iref) and wherein the degraded transconductance detect word line voltage (Vwl) comprises a voltage (i) below the corresponding word line voltage for the normal pre-conditioned programmed bit cells and (ii) above the word line voltage for a bit cell of degraded transconductance.

7. The method of claim 1, wherein the verification reference current (Iref) comprises one-quarter of a normal program operation reference current (Iref) and wherein the value for the verification word line voltage (Vwl) comprises a voltage equal to (i) an average word line voltage for all bit cells minus (ii) a degraded transconductance detection limit.

8. The method of claim 7, wherein the degraded transconductance detection limit comprises one-half of the pre-conditioning threshold voltage distribution width.

9. The method of claim 8, wherein the degraded transconductance detection limit comprises 250 millivolts.

10. The method of claim 1, wherein the verification reference current (Iref) comprises one-quarter of a normal program operation reference current (Iref) and wherein the value for the verification word line voltage (Vwl) is selected across a range of voltages from an average voltage to a voltage corresponding to a least programmed bit, the method further comprising:
    instead of determining whether any read bit cell is erased, determining whether the lowest value of word line voltage (Vwl) for the least programmed bit occurs at a voltage above a Vwl_lower_limit value, wherein (i) responsive to the lowest value of word line voltage (Vwl) being lower than the Vwl_lower_limit value, then at least one bit cell of the memory array is detected as having degraded transconductance, and (ii) responsive to the lowest value of word line voltage (Vwl) being greater than or equal to the Vwl_lower_limit value, then no bit cell of the memory array is detected as having degraded transconductance.

11. The method of claim 10, wherein the least programmed bit represents the bit cell having a lowest value of word line voltage (Vwl) in the pre-conditioning threshold voltage distribution.

12. The method of claim 10, wherein the Vwl_lower_limit value is equal to (i) an average word line voltage for all bit cells minus (ii) a degraded transconductance detection limit.

13. The method of claim 12, wherein the degraded transconductance detection limit comprises one-half of the pre-conditioning threshold voltage distribution width.

14. The method of claim 13, wherein the degraded transconductance detection limit comprises 250 millivolts.

15. The method of claim 1, wherein determining whether any bit cell read is erased further comprises (i) responsive to any bit cell being erased, then failing the memory array as having detected degraded transconductance in at least one bit cell of the memory array, and (ii) responsive to no bit cell being erased, then passing the memory array as not having detected degraded transconductance in any bit cell.

16. A method for detecting degraded transconductance in bit cells of a memory array comprising:
    performing a pre-conditioning program operation on the bit cells with use of a pre-conditioning reference current and pre-conditioning bit line and word line voltages to render the bit cells programmed, the programmed bit cells collectively having a pre-conditioning threshold voltage distribution width less than a threshold voltage distribution width resulting from a normal program operation on the bit cells;
    reading all bit cells with use of a verification reference current and verification word line voltage, the verification reference current and word line voltage being different from the pre-conditioning reference current and word line voltage, respectively, wherein the verification reference current (Iref) comprises one-quarter of a normal program operation reference current (Iref); and
    performing one selected from the group consisting of (i) determining whether any read bit cell is erased, as opposed to being programmed, wherein (a) responsive to any bit cell being erased, then at least one bit cell of the memory array is detected as having degraded transconductance, and (b) responsive to no bit cell being erased, then no bit cell of the memory array is detected as having degraded transconductance, and (ii) determining whether the lowest value of word line voltage (Vwl) for the least programmed bit occurs at a voltage above a Vwl_lower_limit value, wherein (a) responsive to the lowest value of word line voltage (Vwl) being lower than the Vwl_lower_limit value, then at least one bit cell of the memory array is detected as having degraded transconductance, and (b) responsive to the lowest value of word line voltage (Vwl) being greater than or equal to the Vwl_lower_limit value, then no bit cell of the memory array is detected as having degraded transconductance.

17. The method of claim 16, wherein the value for the verification word line voltage (Vwl) is selected across a range of voltages from a minimum voltage to a voltage corresponding to a least programmed bit.

18. The method of claim 16, further wherein (iii) responsive to any bit cell being erased or the lowest value of word line voltage (Vwl) being lower than the Vwl_lower_limit value, then failing the memory array as having detected degraded transconductance in at least one bit cell of the memory array, and (iv) responsive to no bit cell being erased or the lowest value of word line voltage (Vwl) being greater than or equal to the Vwl_lower_limit value, then passing the memory array as not having detected degraded transconductance in any bit cell.

19. The method of claim 16, wherein the pre-conditioning program operation comprises programming the bit cells on a bit by bit basis with predefined values of increased reference current (Iref), reduced bit line voltage (Vbl), and reduced word line voltage (Vwl) with respect to corresponding values for the normal program operation.

20. A method for detecting degraded transconductance in bit cells of a memory array comprising:
    performing a pre-conditioning program operation on the bit cells with use of a pre-conditioning reference current and pre-conditioning bit line and word line voltages to render the bit cells programmed, the programmed bit cells collectively having a pre-conditioning threshold voltage distribution width less than a threshold voltage distribution width resulting from a normal program operation on the bit cells, wherein the pre-conditioning program operation comprises programming the bit cells on a bit by bit basis with predefined values of increased reference current (Iref), reduced bit line voltage (Vbl), and reduced word line voltage (Vwl) with respect to corresponding values for the normal program operation;
    reading all bit cells with use of a verification reference current and verification word line voltage, the verification reference current and word line voltage being different from the pre-conditioning reference current and word line voltage, respectively, wherein the verification reference current (Iref) comprises one-quarter of a normal program operation reference current (Iref) and wherein the value for the verification word line voltage (Vwl) is selected across a range of voltages from a minimum voltage to a voltage corresponding to a least programmed bit; and
    performing one selected from the group consisting of (i) determining whether any read bit cell is erased, as opposed to being programmed, wherein (a) responsive to any bit cell being erased, then at least one bit cell of the memory array is detected as having degraded transconductance, and (b) responsive to no bit cell being erased, then no bit cell of the memory array is detected as having degraded transconductance, and (ii) determining whether the lowest value of word line voltage (Vwl) for the least programmed bit occurs at a voltage above a Vwl_lower_limit value, wherein (a) responsive to the lowest value of word line voltage (Vwl) being lower than the Vwl_lower_limit value, then at least one bit cell of the memory array is detected as having degraded transconductance, and (b) responsive to the lowest value of word line voltage (Vwl) being greater than or equal to the Vwl_lower_limit value, then no bit cell of the memory array is detected as having degraded transconductance.

* * * * *